United States Patent [19]

Ehrenhalt et al.

[11] Patent Number: 4,847,517
[45] Date of Patent: Jul. 11, 1989

[54] MICROWAVE TUBE MODULATOR

[75] Inventors: Dan Ehrenhalt, Buffalo; George R. Giles, Getzville, both of N.Y.

[73] Assignee: LTV Aerospace & Defense Co., Dallas, Tex.

[21] Appl. No.: 155,983

[22] Filed: Feb. 16, 1988

[51] Int. Cl.$^4$ .......................... H03K 3/01; H03K 3/30; H03K 5/08; H03L 5/00

[52] U.S. Cl. ..................................... 307/270; 307/264; 307/282; 307/296 R; 328/34; 328/65

[58] Field of Search .............. 307/270, 264, 268, 282, 307/296.1, 296.3, 296.5; 328/34, 65

[56] References Cited

U.S. PATENT DOCUMENTS

| | | | |
|---|---|---|---|
| 3,374,406 | 3/1968 | Wallmark | 357/23.12 |
| 3,374,407 | 3/1968 | Olmstead | 357/23.12 |
| 3,426,255 | 2/1969 | Heywang | 357/23.5 |
| 3,562,672 | 2/1971 | Sugimoto et al. | 332/9 R |
| 3,582,975 | 6/1971 | King | 307/570 |
| 3,828,324 | 8/1974 | Vigil et al. | 364/200 |
| 3,914,555 | 10/1975 | Comas et al. | 379/2 |
| 3,967,217 | 6/1976 | Solomon | 332/9 R |
| 3,995,178 | 11/1976 | Gilbert | 328/127 |
| 4,010,450 | 3/1977 | Porter et al. | 364/200 |
| 4,071,777 | 1/1978 | Hermann | 307/494 |
| 4,095,251 | 6/1978 | Dennard et al. | 357/23.11 |
| 4,143,387 | 3/1979 | Stikvoort | 357/23.4 |
| 4,221,044 | 9/1980 | Godejahn, Jr. et al. | 357/45 |
| 4,235,010 | 11/1980 | Kawagoe | 357/41 |
| 4,247,903 | 1/1981 | Grudkoski et al. | 364/821 |
| 4,262,296 | 4/1981 | Shealy et al. | 357/55 |
| 4,304,042 | 12/1981 | Yeh | 357/15 |
| 4,328,470 | 5/1982 | Bumgardner | 332/9 T |
| 4,409,594 | 10/1983 | Graziani | 364/451 |
| 4,425,527 | 1/1984 | Sichel | 313/112 |
| 4,565,931 | 1/1986 | Fumey | 307/270 |
| 4,679,050 | 7/1987 | Bergman | 364/726 |
| 4,679,299 | 7/1987 | Szluk et al. | 357/41 |
| 4,683,387 | 7/1987 | Jones et al. | 307/314 |
| 4,689,802 | 8/1987 | McCambridge | 332/9 R |

FOREIGN PATENT DOCUMENTS 8202296  7/1982  France ............................. 307/268

Primary Examiner—John Zazworsky
Assistant Examiner—Trong Quang Phan
Attorney, Agent, or Firm—Brooks & Kushman

[57] ABSTRACT

Provided is a modulator having two amplifying stages for supplying high-voltage pulses to the primary winding of a transformer connected to a microwave transmitter tube. The first stage uses field-effect transistors connected in a common source configuration to amplify input pulses to drive the second stage, which uses field-effect transistors connected in a common gate configuration to drive the transformer. The circuit configuration provides a large voltage swing across the transformer primary and a short transistor switching time.

24 Claims, 2 Drawing Sheets

MICROWAVE TUBE MODULATOR

TECHNICAL BACKGROUND

This invention relates to modulators used to provide high-voltage pulses to microwave transmitter tube input transformers.

BACKGROUND ART

A number of devices have been designed to provide pulses for use in microwave modulation applications. Some of these use field-effect transistors (FET's) connected in parallel, and conventional designs use parallel FET's connected in a common source configuration. Such a configuration places comparative limits on the maximum voltages available at microwave tube modulator outputs and does not minimize the effects of drain-to-gate (Miller) capacitance, which adversely affects FET switching speeds. See, for example, U.S. Pat. Nos. 3,374,406; 3,374,407; 3,426,255; 3,509,567; 3,525,861; 3,544,399; 3,562,672; 3,582,975; 3,828,324; 3,914,555; 3,967,217; 3,995,178; 4,010,450; 4,071,777; 4,095,251; 4,143,387; 4,221,044; 4,235,010; 4,247,903; 4,262,296; 4,304,042; 4,328,470; 4,409,594; 4,425,527; 4,662,058; 4,679,050; 4,679,299; 4,683,387; and 4,689,802.

The present invention provides a modulator comprising a combination of elements that simultaneously provides comparatively higher output voltages and shorter output pulse rise and fall times than conventionally configured, similarly applied, microwave tube modulators.

DISCLOSURE OF THE INVENTION

In accordance with the present invention, a modulator is provided that is capable of supplying high-voltage pulses having short rise and fall times to the primary windings of appropriately selected transformers connected to a large number of different microwave transmitter tubes such as magnetrons, pulse cavity oscillators, cross field amplifiers and traveling wave tubes.

The preferred embodiment of the present invention contemplates a modulator having a first stage using a number of parallel field-effect transistors (FET's) connected in a common source configuration to amplify input pulses for driving a second stage using a number of parallel FET's connected in a common gate configuration for driving a microwave transmitter tube transformer.

The preferred embodiment of the present invention also contemplates the use of fail-soft means for ensuring the survival and continued operation of the total modulator circuit in the event of the failure of one or more FET's, an extremely desirable feature if the embodiment is to be used in remote or aircraft installations.

The invention further contemplates a modulator that has a relatively high switching speed.

The present invention also contemplates a modulator that requires a relatively low operating voltage.

The invention also contemplates a modulator that can, by using appropriate output transformers, be matched to a large number of microwave transmitter tubes.

The invention additionally contemplates a modulator that can supply high-voltage pulses having different pulse widths.

The invention further contemplates a modulator that is relatively small.

The invention also contemplates a modulator that is easy to produce and maintain.

BRIEF DESCRIPTION OF THE DRAWINGS

In the drawings, in which like reference characters indicate corresponding parts in all the figures.

DETAILED DESCRIPTION OF THE PREFERRED EMBODIMENT OF THE INVENTION

Figure 1:
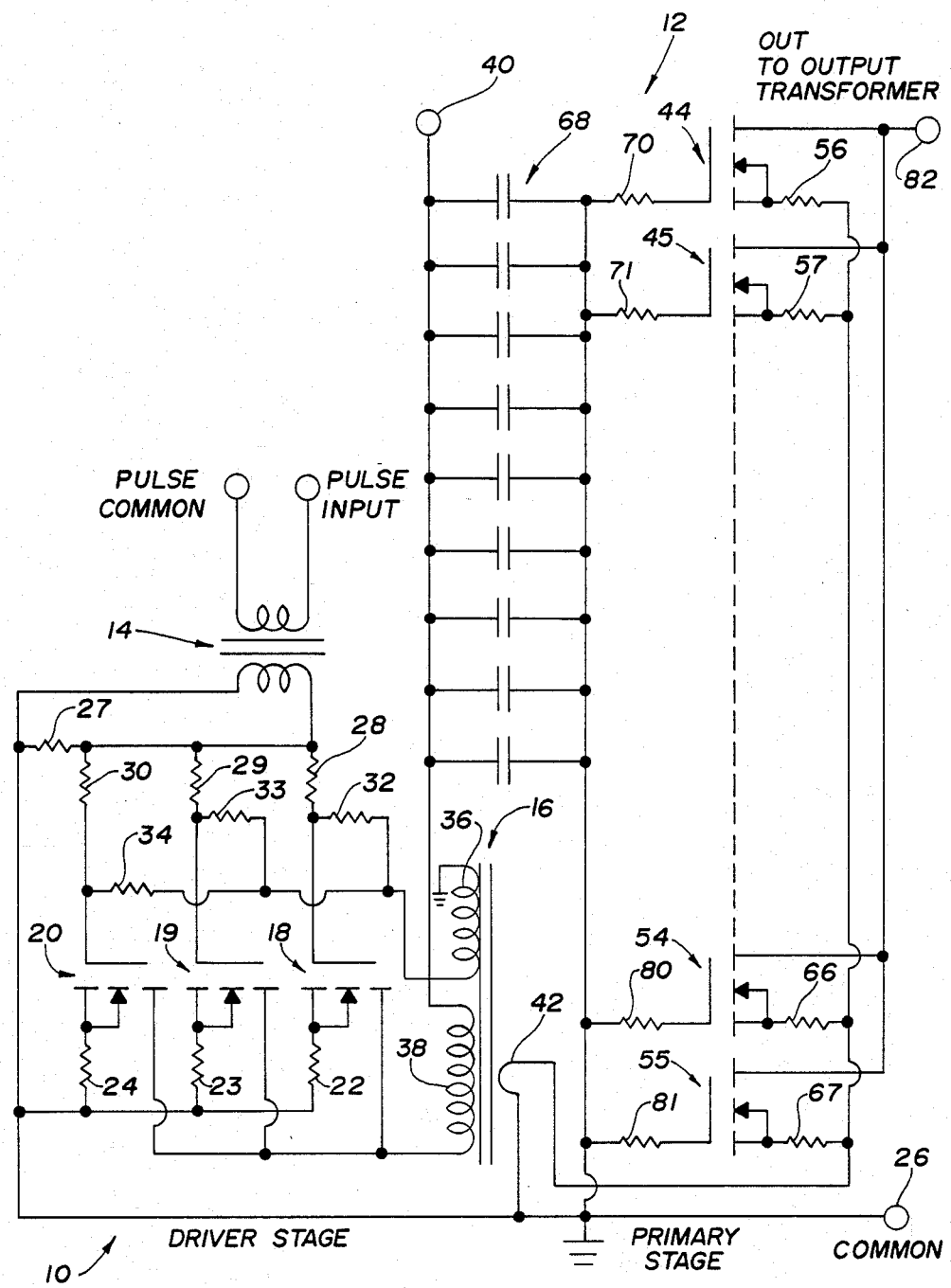
FIG. 1 shows, schematically, the microwave tube modulator.

With reference to FIG. 1, shown is a schematic representation of a microwave tube modulator unit having a first amplifier, or driver, stage 10 and a second amplifier, or primary circuit, stage 12. An input coupling device, or first electrical transformer, 14 inductively connects an input signal, or pulse, source (not shown) to the input of the first stage 10 of the modulator, and a first coupling device, or second electric transformer, 16 inductively connects the output of the first stage 10 to the input of the second stage 12.

The first, or driver, stage 10 of the modulator has, in the embodiment shown, three field-effect transistors (FET's) 18, 19 and 20 connected in parallel in a common source configuration. The source terminal of each of the three driver stage transistors 18, 19 and 20 is connected through one of three associated resistors 22, 23 and 24 respectively to the common terminal 26 and is grounded. Each of the resistors 22, 23 and 24 is a fuse resistor and will open the source circuit of its associated FET if that transistor fails and draws excessive current. This action will effectively remove the defective transistor from the modulator circuit, leaving the overall circuit to function at reduced power but otherwise in a relatively normal manner.

The secondary winding of the input transformer 14 is electrically shunted by a resistor 27, one end of which is connected to the common terminal 26 and is grounded. Pulses induced in the secondary winding of the input transformer 14 are applied through resistors 28, 29 and 30 to the gate terminals of the three driver stage FET's 18, 19 and 20 respectively. The gate terminals of the FET's 18, 19 and 20 are connected through resistors 32, 33 and 34 respectively to one end of a second coupling device, or feedback winding, 36 of the coupling transformer 16, the other end of the winding 36 being connected to ground. The drain terminals of the FET's 18, 19 and 20 are connected directly to one end of the primary winding 38 of the coupling transformer 16, and the opposite end of the primary winding 38 is connected to a source of positive voltage (as at 40), 300 volts in the embodiment shown.

The second, or primary, stage 12 of the modulator has, in the embodiment shown, twelve power FET's (indicated by consecutive reference numbers 44 through 55) connected in parallel in a common gate configuration. The secondary winding 42 of the coupling transformer 16 is connected at one end to the common terminal 26 and is grounded. Pulses induced in the secondary winding 42 of the transformer 16 are applied to the source terminal of each of twelve primary stage transistors (indicated by consecutive reference numbers 44 through 55) through twelve associated resistors (indicated by consecutive reference numbers 56 through 67 respectively). Each of the resistors 56 through 67 is a fuse resistor and will open the source circuit of its associated FET if that transistor fails and draws excessive current. This action will effectively remove the defective transistor from the modulator circuit, leaving the overall circuit to function at reduced power but otherwise in a relatively normal manner.

Also connected to the source of positive voltage 40 is one side of a storage device, or electrical capacitor bank, 68 used to store primary stage electrical charges. The other side of the capacitor bank 68 is connected to the common terminal 26 and is grounded. The gate terminal of each of the twelve primary stage FET's (indicated by consecutive reference numbers 44 through 55) is connected respectively to one of twelve resistors (indicated by consecutive reference numbers 70 through 81) the other end of which is connected to the common terminal 26 and is grounded. The resistors (70 through 81) minimize parasitic oscillations in the transistor gate circuitry. The drain terminal of each of the twelve primary stage FET's (44 through 55) is connected to an output terminal 82.

A microwave tube (not shown) connected to the secondary winding of a suitable output transformer (also not shown) may be coupled to the modulator by connecting the primary winding of the transformer to the output terminal 82.

Figure 2:
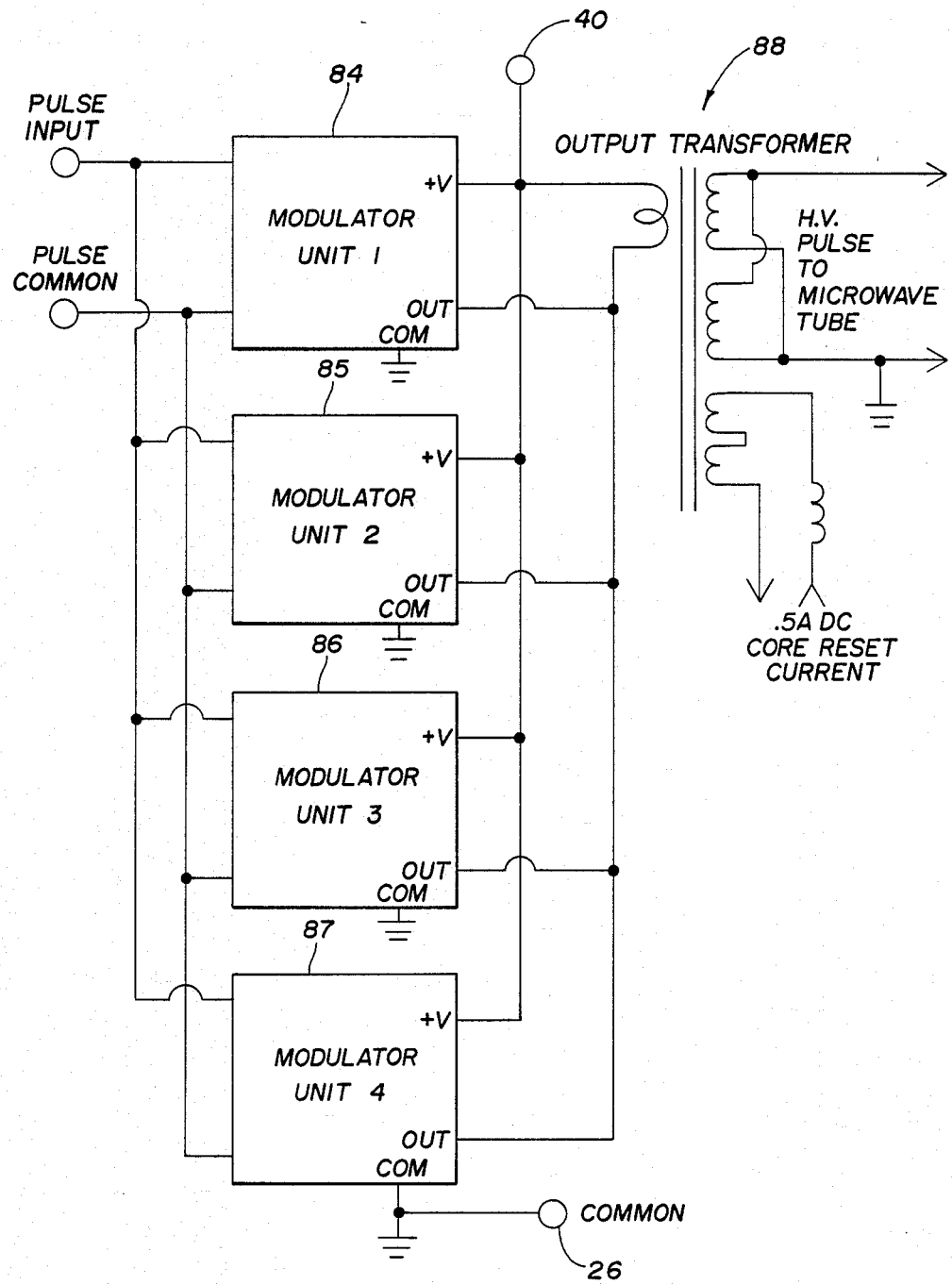
FIG. 2 shows, schematically, a preferred combination of microwave tube modulator units connected to supply high power pulses to the primary circuit of a transformer connected to a microwave transmitter tube.

The microwave tube modulator just described may be advantageously combined if more power is required than can be provided by a single unit. A typical arrangement having four units (indicated by consecutive reference numbers 84 through 87) connected in parallel is shown in FIG. 2. Their combined outputs are connected to the primary winding of an output transformer 88 that has a high secondary-winding-to-primary-winding turns ratio selected to match the voltage and current requirements of the microwave tube to be connected to the secondary winding of the transformer.

The transistors used in the embodiment shown may be n-channel, enhancement-mode, metal-oxide silicon, field-effect transistors. An enhancement-mode type of FET is constructed so that it effectively has no channel until an appropriate gate voltage is applied. A direct-current operating condition is established by applying a positive voltage to the drain. As shown, the substrate is connected to the source. Both are effectively at ground potential, and channel electrons are attracted to the positive drain. A voltage applied to the gate controls the current flow. When a negative voltage is applied to the gate, positively charged holes from the p-type substrate are attracted toward the gate, effectively narrowing the conducting channel and reducing the source-drain current. When a positive voltage is applied to the gate, the positively charged holes are repelled, effectively widening the conducting channel and increasing the source-drain current.

Prior to the application of an input signal, the capacitor bank connected between the source of positive voltage 40 and ground is charged. A positive input signal is applied through resistors 28, 29 and 30 to the gates of transistors 18, 19 and 20, making them positive with respect to their associated sources and enabling current to flow through the current channel between the source and drain of each respective transistor. This completes a path enabling electrical energy stored in the capacitor bank 68 to flow as current through the primary winding 38 of the coupling transformer 16. The feedback winding 36 of the coupling transformer 16 provides feedback current through resistors 32, 33 and 34 to the respective gates of the transistors 18, 19 and 20 of the driver stage 10. The feedback acts to stabilize the gain of the driver stage 10.

The primary-winding-to-secondary-winding turns ratio is high, and a large current is induced into the secondary winding 42. Since the gates of the power transistors 44 through 55 are positive with respect to their sources, the large current induced in the secondary winding 42 will flow through the current channel between the source and drain of each respective transistor and be applied to the primary winding of the output transformer 88 shown in FIG. 2. This cycle is repeated for each positive pulse applied to the input of the modulator.

During the operation of this configuration, the source terminals of the power FET's (indicated by consecutive reference numbers 44 through 55) may be driven to a potential of approximately minus twenty volts; therefore, the drain terminals of the FET's can be driven to a potential of zero volts, providing 300-volt pulses across the primary winding of the output transformer.

Typical pulse voltage requirements for microwave transmitter tubes range from 15 to 35 kilovolts. The embodiment of the microwave tube modulator represented in FIG. 2 requires only 300 volts of direct current for its operation and will supply a current of 2600 to 3000 amperes to the primary winding of the output transformer 88 and provide sufficient power to operate a 250 kilowatt magnetron.

The common gate configuration of the power transistors in the second, or primary, stage of the modulator minimizes the effects of drain-to-gate (Miller) capacitance and thereby increases the switching speed of the power FET's over that obtainable by transistors having a common source configuration. The power FET's shown have switching times that are less than 100 nanoseconds.

What is claimed is:

1. A microwave tube modulator for amplifying an electrical input signal, said microwave tube modulator comprising:

first amplifier means, having an input receiving the electrical input signal, an output, and a plurality of field-effect transistors connected in a common source configuration, for amplifying the electrical input signal to generate a first electrical output signal, said field-effect transistors each having at least a source, a gate, and a drain;

second amplifier means, having an input electrically coupled to the output of said first amplifier means, an output, and a plurality of field-effect transistors connected in a common gate configuration, for amplifying said first electrical output signal generated by said first amplifier means to generate a second electrical output signal, said field-effect transistors each having at least a source, a gate, and a drain;

a storage device for storing electrical energy;

first coupling means for conducting electrical energy from said storage device to said first amplifier means and for coupling said first electrical output signal to the input of said second amplifier means; and second coupling means for coupling a feedback current representative of said first electrical output signal to said field-effect transistors in said first amplifier means to stabilize the gain of said first amplifier means.

2. A microwave tube modulator according to claim 1, further comprising an input coupling device for coupling the electrical input signal to the input of said first amplifier means.

3. A microwave tube modulator according to claim 2 wherein said input coupling device is a first electrical transformer.

4. A microwave tube modulator according to claim 3, wherein said input coupling device is a first electrical transformer having a primary winding to receive the electrical input signal and a secondary winding connected to the input of said first amplifier means.

5. A microwave tube modulator according to claim 1, wherein said first coupling said means includes a primary winding and a secondary winding of a second electrical connected between a common ground and said second amplifier means.

6. A microwave tube modulator according to claim 5, wherein said second coupling means includes a feedback winding on said second electrical transformer, said feedback winding being electrically connected between a common ground and said first amplifier means.

7. A microwave tube modulator according to claim 6 wherein the turns ratio of said primary winding to said secondary winding is high.

8. A microwave tube modulator according to claim 1 wherein said storage device comprises at least one electrical capacitor.

9. A microwave tube modulator according to claim 1 wherein said field-effect transistors are n-channel, enhancement-type, metal-oxide silicon, field-effect transistors.

10. A microwave tube modulator according to claim 1, further including current-sensitive means electrically connected in series with the source of each of said field-effect transistors in said first amplifier means and said second amplifier means for protecting the microwave tube modulator from excessive electrical current flowing through said field-effect transistors by electrically removing from the microwave tube modulator any of said field-effect transistors subjected to or causing excessive current flow between its source and its drain.

11. A microwave tube modulator according to claim 10, wherein said current-sensitive device comprises a fuse resistor electrically connected in series with the source of each field-effect transistor.

12. A microwave tube modulator according to claim 1, wherein said first amplifier means has a plurality of field-effect transistors connected in a common source configuration, and said second amplifier means has a plurality of field-effect transistors connected in a common gate configuration, the combination of said first amplifier means, said first coupling means, said second amplifier means, said storage device, and said second coupling means forming an integral, microwave tube modulator unit.

13. A microwave tube modulator according to claim 12, wherein said first amplifier means has three field-effect transistors connected in a common source configuration, and said second amplifier means has twelve field-effect transistors connected in a common gate configuration.

14. A microwave tube modulator according to claim 12, wherein said integral, microwave tube modulator unit is capable of being connected to at least one other of said integral, microwave tube modulator units for cooperatively providing electrical power equal to the cumulative power of all of said integral, microwave tube modulator units so connected.

15. A microwave tube modulator for amplifying an electrical input signal, said microwave tube modulator comprising:

first amplifier means, having an input receiving the electrical input signal, an output, and a plurality of field-effect transistors connected in a common source configuration, for amplifying the electrical input signal to generate a first electrical output signal, said field-effect transistors each having at least a source, a gate, and a drain;

a first electrical transformer for coupling the electrical input signal to the input of said first amplifier means;

second amplifier means, having an input electrically coupled to the output of said first amplifier means, an output, and a plurality of field-effect transistors connected in a common gate configuration, for amplifying said first electrical output signal generated by said first amplifier means to generate a second electrical output signal, said field-effect transistors each having at least a source, a gate, and a drain;

a storage device having at least one electrical capacitor for storing electrical energy; and a second electrical transformer for conducting electrical energy from said storage device to said first amplifier means, for coupling said first electrical output to the input of said second amplifier means, and for coupling a feedback current representative of said first electrical output signal to said field-effect transistors in said first amplifier means to stabilize the gain of said first amplifier means.

16. A microwave tube modulator according to claim 15, wherein said second electrical transformer has a primary winding electrically connected between said storage device and said first amplifier means, a secondary winding electrically connected to said second amplifier means, and a feedback winding electrically connected to said first amplifier means.

17. A microwave tube modulator according to claim 16 wherein the turns ratio of said primary winding to said secondary winding is high.

18. A microwave tube modulator according to claim 15 wherein said storage device comprises a plurality of electrical capacitors connected in parallel.

19. A microwave tube modulator according to claim 15 wherein said field-effect transistors are n-channel, enhancement-type, metal-oxide silicon, field-effect transistors.

20. A microwave tube modulator according to claim 15, wherein said first amplifier means has a plurality of field-effect transistors connected in a common source configuration; and said second amplifier means has a plurality of field-effect transistors connected in a common gate configuration, the combination of said first amplifier means, said first electrical transformer, said second amplifier means, said storage device, and said second electrical transformer forming an integral, microwave tube modulator unit.

21. A microwave tube modulator according to claim 20, wherein said integral, microwave tube modulator unit is capable of being connected to at least one other of said integral, microwave tube modulator units for cooperatively providing electrical power equal to the cumulative power of all of said integral, microwave tube modulator units so connected.

22. A microwave tube modulator according to claim 20, wherein said first amplifier means has three field-effect transistors connected in a common source configuration, and said second amplifier means has twelve field-effect transistors connected in a common gate configuration.

23. A microwave tube modulator according to claim 15, further including current-sensitive means electrically connected in series with the source of each of said field-effect transistors in said first amplifier means and said second amplifier means for protecting the microwave tube modulator from excessive electrical current flowing through said field-effect transistors by electrically removing from the microwave tube modulator any of said field-effect transistors subjected to or causing excessive current flow between its source and its drain.

24. A microwave tube modulator according to claim 23, wherein said current-sensitive device comprises a fuse resistor electrically connected in series with the source of each field-effect transistor.

* * * * *